US012696754B2

(12) United States Patent
Kim et al.

(10) Patent No.: US 12,696,754 B2
(45) Date of Patent: Jul. 28, 2026

(54) INTERCONNECT STRUCTURE HAVING DIFFERENT DIMENSIONS FOR CONNECTED CIRCUIT BLOCKS IN INTEGRATED CIRCUIT

(71) Applicant: SAMSUNG ELECTRONICS CO., LTD., Suwon-si (KR)

(72) Inventors: Eun Sung Kim, Clifton Park, NY (US); Hyoeun Park, Cohoes, NY (US); Kang-ill Seo, Albany, NY (US)

(73) Assignee: Samsung Electronics Co., Ltd. (KR)

( * ) Notice: Subject to any disclaimer, the term of this patent is extended or adjusted under 35 U.S.C. 154(b) by 695 days.

(21) Appl. No.: 17/849,345

(22) Filed: Jun. 24, 2022

(65) Prior Publication Data

US 2023/0402375 A1 Dec. 14, 2023

Related U.S. Application Data

(60) Provisional application No. 63/332,935, filed on Apr. 20, 2022, provisional application No. 63/308,615, filed on Feb. 10, 2022.

(51) Int. Cl.
| | |
|---|---|
| *H10W 20/41* | (2026.01) |
| *H10P 50/00* | (2026.01) |
| *H10W 20/00* | (2026.01) |
| *H10W 20/42* | (2026.01) |

(52) U.S. Cl.
CPC ........... *H10W 20/435* (2026.01); *H10P 50/71* (2026.01); *H10W 20/031* (2026.01); *H10W 20/42* (2026.01)

(58) Field of Classification Search
CPC . H01L 2224/02372; H01L 2224/05009; H01L 2224/05025; H01L 2224/05087; H01L 2224/0557; H01L 2224/08146; H01L 2225/06541–06544; H01L 23/5226; H01L 23/481; H01L 21/76885; H01L 21/76898
See application file for complete search history.

(56) References Cited

U.S. PATENT DOCUMENTS

| | | | | |
|---|---|---|---|---|
| 5,269,879 | A | * | 12/1993 | Rhoades ............. H10W 20/081 257/E21.252 |
| 5,640,049 | A | | 6/1997 | Rostoker et al. |
| 5,659,202 | A | * | 8/1997 | Ashida .................. H10W 72/20 257/E23.021 |

(Continued)

FOREIGN PATENT DOCUMENTS

| | | |
|---|---|---|
| CN | 113363201 A | 9/2021 |
| CN | 113594133 A | 11/2021 |

(Continued)

OTHER PUBLICATIONS

The Extended European Search Report issued on Oct. 4, 2023 by the European Patent Office for European Patent Application No. 23168414.3.

*Primary Examiner* — Joshua Benitez Rosario
*Assistant Examiner* — Moataz Khalifa
(74) *Attorney, Agent, or Firm* — Myers Bigel, P.A.

(57) ABSTRACT

A interconnect structure for an integrated circuit may include: a metal line including a plurality of sections having different thicknesses along a $1^{st}$ direction; and a plurality of vias respectively protruding from the plurality of sections of the metal line.

20 Claims, 5 Drawing Sheets

10

(56)                References Cited

U.S. PATENT DOCUMENTS

| | | | |
|---|---|---|---|
| 6,074,952 A * | 6/2000 | Liu | H10B 12/09 |
| | | | 438/743 |
| 6,136,686 A * | 10/2000 | Gambino | H10W 20/095 |
| | | | 257/E21.507 |
| 6,433,436 B1 | 8/2002 | Feild et al. | |
| 6,605,874 B2 | 8/2003 | Leu et al. | |
| 7,125,792 B2 | 10/2006 | Kumar et al. | |
| 7,414,275 B2 | 8/2008 | Greenberg et al. | |
| 8,420,533 B2 | 4/2013 | Seidel et al. | |
| 8,759,212 B2 * | 6/2014 | Kume | H01L 21/31116 |
| | | | 438/763 |
| 9,786,557 B1 | 10/2017 | Chi et al. | |
| 10,020,254 B1 | 7/2018 | Bao et al. | |
| 10,026,687 B1 | 7/2018 | Lin et al. | |
| 10,319,629 B1 | 6/2019 | Yang et al. | |
| 10,622,301 B2 | 4/2020 | Xu et al. | |
| 10,672,705 B2 | 6/2020 | Xu et al. | |
| 10,763,159 B2 | 9/2020 | Briggs et al. | |
| 10,867,853 B2 | 12/2020 | Lin et al. | |
| 10,971,356 B2 | 4/2021 | Fan et al. | |
| 10,978,388 B2 | 4/2021 | Amanapu et al. | |
| 11,037,822 B2 | 6/2021 | Mignot et al. | |
| 11,094,580 B2 | 8/2021 | Park et al. | |
| 11,152,298 B2 | 10/2021 | Mignot et al. | |
| 11,189,528 B2 | 11/2021 | Arnold et al. | |

| | | | |
|---|---|---|---|
| 2001/0055873 A1 * | 12/2001 | Watanabe | H10P 14/6922 |
| | | | 257/E21.271 |
| 2008/0020540 A1 * | 1/2008 | Takeda | H10W 20/087 |
| | | | 257/E21.09 |
| 2013/0168869 A1 | 7/2013 | Xu | |
| 2016/0307852 A1 * | 10/2016 | Shih | H01L 24/05 |
| 2017/0294347 A1 | 10/2017 | Chi et al. | |
| 2018/0260360 A1 * | 9/2018 | Samadi | H10D 88/00 |
| 2020/0098591 A1 | 3/2020 | Lin et al. | |
| 2020/0135457 A1 | 4/2020 | Fan et al. | |
| 2020/0135640 A1 | 4/2020 | Sio et al. | |
| 2020/0411435 A1 | 12/2020 | Liu et al. | |
| 2021/0111070 A1 | 4/2021 | Bae et al. | |
| 2021/0125862 A1 * | 4/2021 | Zhu | H01L 23/5226 |
| 2021/0280456 A1 * | 9/2021 | Huang | H01L 21/76897 |
| 2021/0313262 A1 | 10/2021 | Fu et al. | |
| 2021/0407907 A1 | 12/2021 | Yoo et al. | |
| 2022/0020688 A1 | 1/2022 | Xie et al. | |
| 2023/0132353 A1 * | 4/2023 | Xie | H01L 23/535 |
| | | | 257/288 |
| 2025/0167106 A1 * | 5/2025 | Choi | H10W 20/42 |

FOREIGN PATENT DOCUMENTS

| | | |
|---|---|---|
| TW | 392354 B | 6/2000 |
| TW | 201830536 A | 8/2018 |
| TW | 202005101 A | 1/2020 |

* cited by examiner

Figure 3:
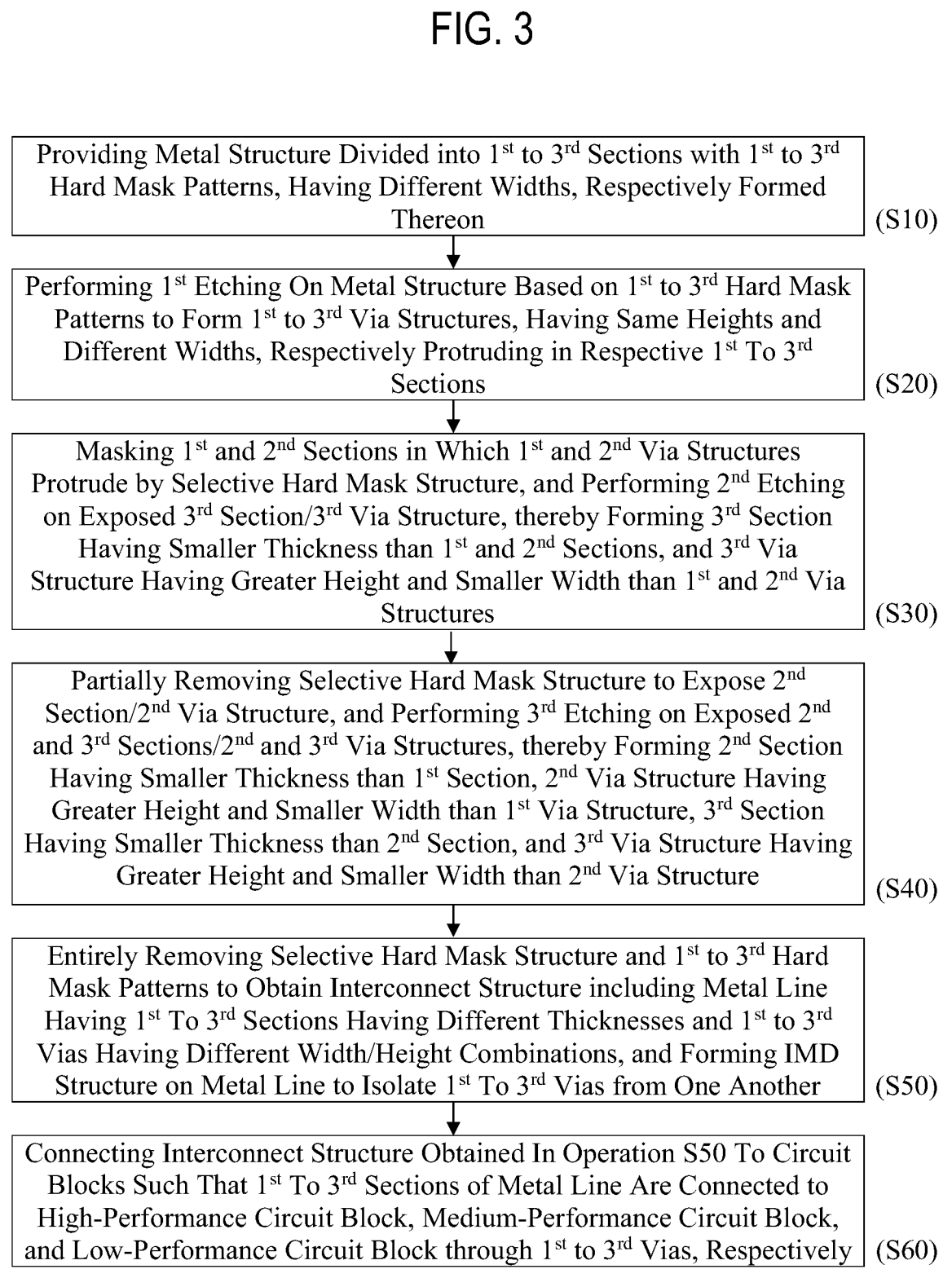

Providing Metal Structure Divided into $1^{st}$ to $3^{rd}$ Sections with $1^{st}$ to $3^{rd}$ Hard Mask Patterns, Having Different Widths, Respectively Formed Thereon    (S10)

↓

Performing $1^{st}$ Etching On Metal Structure Based on $1^{st}$ to $3^{rd}$ Hard Mask Patterns to Form $1^{st}$ to $3^{rd}$ Via Structures, Having Same Heights and Different Widths, Respectively Protruding in Respective $1^{st}$ To $3^{rd}$ Sections    (S20)

↓

Masking $1^{st}$ and $2^{nd}$ Sections in Which $1^{st}$ and $2^{nd}$ Via Structures Protrude by Selective Hard Mask Structure, and Performing $2^{nd}$ Etching on Exposed $3^{rd}$ Section/$3^{rd}$ Via Structure, thereby Forming $3^{rd}$ Section Having Smaller Thickness than $1^{st}$ and $2^{nd}$ Sections, and $3^{rd}$ Via Structure Having Greater Height and Smaller Width than $1^{st}$ and $2^{nd}$ Via Structures    (S30)

↓

Partially Removing Selective Hard Mask Structure to Expose $2^{nd}$ Section/$2^{nd}$ Via Structure, and Performing $3^{rd}$ Etching on Exposed $2^{nd}$ and $3^{rd}$ Sections/$2^{nd}$ and $3^{rd}$ Via Structures, thereby Forming $2^{nd}$ Section Having Smaller Thickness than $1^{st}$ Section, $2^{nd}$ Via Structure Having Greater Height and Smaller Width than $1^{st}$ Via Structure, $3^{rd}$ Section Having Smaller Thickness than $2^{nd}$ Section, and $3^{rd}$ Via Structure Having Greater Height and Smaller Width than $2^{nd}$ Via Structure    (S40)

↓

Entirely Removing Selective Hard Mask Structure and $1^{st}$ to $3^{rd}$ Hard Mask Patterns to Obtain Interconnect Structure including Metal Line Having $1^{st}$ To $3^{rd}$ Sections Having Different Thicknesses and $1^{st}$ to $3^{rd}$ Vias Having Different Width/Height Combinations, and Forming IMD Structure on Metal Line to Isolate $1^{st}$ To $3^{rd}$ Vias from One Another    (S50)

↓

Connecting Interconnect Structure Obtained In Operation S50 To Circuit Blocks Such That $1^{st}$ To $3^{rd}$ Sections of Metal Line Are Connected to High-Performance Circuit Block, Medium-Performance Circuit Block, and Low-Performance Circuit Block through $1^{st}$ to $3^{rd}$ Vias, Respectively    (S60)

INTERCONNECT STRUCTURE HAVING DIFFERENT DIMENSIONS FOR CONNECTED CIRCUIT BLOCKS IN INTEGRATED CIRCUIT

CROSS-REFERENCE TO RELATED APPLICATIONS

This application is based on and claims priority from U.S. Provisional Application Ser. Nos. 63/308,615 and 63/332,935 filed on Feb. 10, 2022 and Apr. 20, 2022, respectively, in the U.S. Patent and Trademark Office, the disclosure of which is incorporated herein in its entirety by reference.

BACKGROUND

1. Field

Apparatuses and methods consistent with example embodiments of the disclosure relate to an interconnect structure for an integrated circuit, and more particularly to an interconnect structure including metal lines and vias having different dimensions for connection to circuit blocks having different performance characteristics in an integrated circuit.

2. Description of the Related Art

With increasing packaging density in microelectronic devices, various different circuit blocks requiring different performance characteristics such as power consumption are integrated in a small space of an integrated circuit (IC) such as a system-on-chip (SOC). Accordingly, an interconnect structure including a plurality of metal lines and vias having different sizes may be required to connect these circuit blocks to a power source or other circuit elements.

The related-art damascene process may not be able to pattern metal lines or vias having difference dimensions according to their connection use considering performance characteristics of different circuit blocks.

Further, the damascene process requires barrier metal layers at interfacing surfaces between metal lines and vias and between the vias and an insulation structure such as an inter-metal dielectric (IMD) structure. The barrier metal layers are provided to prevent diffusion of a material(s) such as copper forming metals and vias into the insulation structure to deteriorate a connection performance. The barrier metal layers in an interconnect structure also leave less space for a more conductive metal conductor material such as copper, and decrease resistance/capacitance (RC) characteristic performance. The barrier metal layer may be formed of titanium (Ti), titanium oxide (TiO) or tantalum (Ta).

Thus, there is demand of an improved interconnect structure for an integrated circuit and a method of manufacturing the same.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides example embodiments of an interconnect structure for an integrated circuit and a method of manufacturing the same.

According to embodiments, there is provided an interconnect structure for an integrated circuit that may include: a metal line including a plurality of sections having different thicknesses along a $1^{st}$ direction; and a plurality of vias respectively protruding from the plurality of sections of the metal line.

According to embodiments, the vias may have different protrusion heights in a $2^{nd}$ direction perpendicular to the $1^{st}$ direction, and have different widths in the $1^{st}$ direction.

According to embodiments, each of the sections and each of the vias protruding therefrom may be a single continuous structure without a connection surface therebetween.

According to embodiments, the interconnect structure may further include a dielectric structure isolating the vias from each other, wherein each of the vias and the dielectric structure do not have a barrier metal layer therebetween.

According to embodiments, there is provided an interconnect structure for an integrated circuit that may include: a metal line divided into a plurality of sections extended in a $1^{st}$ direction; and a plurality of vias respectively protruding from the plurality of sections, the vias having different protrusion heights in a $2^{nd}$ direction perpendicular to the $1^{st}$ direction, and different widths in the $1^{st}$ direction.

According to an embodiment, the sections of the metal line may have different thicknesses along the $1^{st}$ direction.

BRIEF DESCRIPTION OF DRAWINGS

Example embodiments of the disclosure will be more clearly understood from the following detailed description taken in conjunction with the accompanying drawings in which:

FIGS. 2A to 2F illustrate cross-sectional views of a method for manufacturing an interconnect structure for an integrated circuit, according to embodiments;

FIG. 3 illustrates a flowchart of the method described in reference to FIGS. 2A to 2F, according to embodiments.

DETAILED DESCRIPTION OF EMBODIMENTS

Figure 1A:
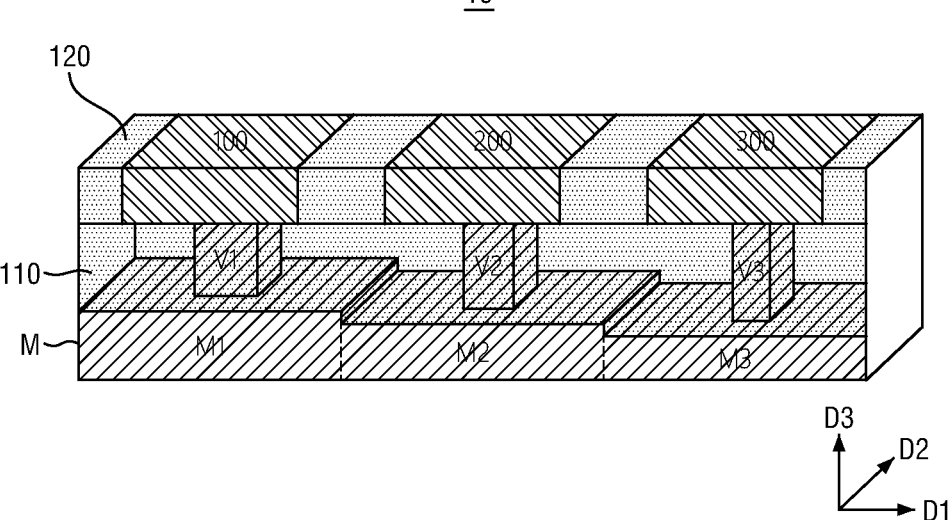
FIG. 1A illustrates a perspective view of an integrated circuit including an interconnect structure, according to an embodiment.

The embodiments of the disclosure described herein are example embodiments, and thus, the disclosure is not limited thereto, and may be realized in various other forms. Each of the embodiments provided in the following descriptions is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a material or materials forming a metal line or a via may not be limited to metals of which examples are taken herein as long as the disclosure can be applied thereto. Further, the use of the via structure or the via scheme described herein may not be limited to a BEOL or MOL of a semiconductor device, and instead, may be applied to a different structure or device.

It will be understood that when an element, component, layer, pattern, structure, region, or so on (hereinafter collectively "element") of a semiconductor device is referred to as being "over," "above," "on," "below," "under," "beneath," "connected to" or "coupled to" another element in the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there may be no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements of an integrated circuit, a semiconductor device and a connection structure in a back-end-of-line (BEOL), a middle-of-line (MOL), front-end-of line (FEOL) and/or a backside power distribution network (BSPDN) of an integrated circuit may or may not be described in detail herein or shown in the drawings. For example, a barrier metal layer formed in a via hole or a trench before a via or a metal line is formed therein may not be shown in the drawings. An etch stop layer formed between two vertically adjacent layers may also not be shown in the drawings. Thus, a height, width or length of a layer, a metal line or a via formed in the layer as described herein and shown in the drawings may include that of the barrier metal layer and/or an etch stop layer.

Figure 1B:
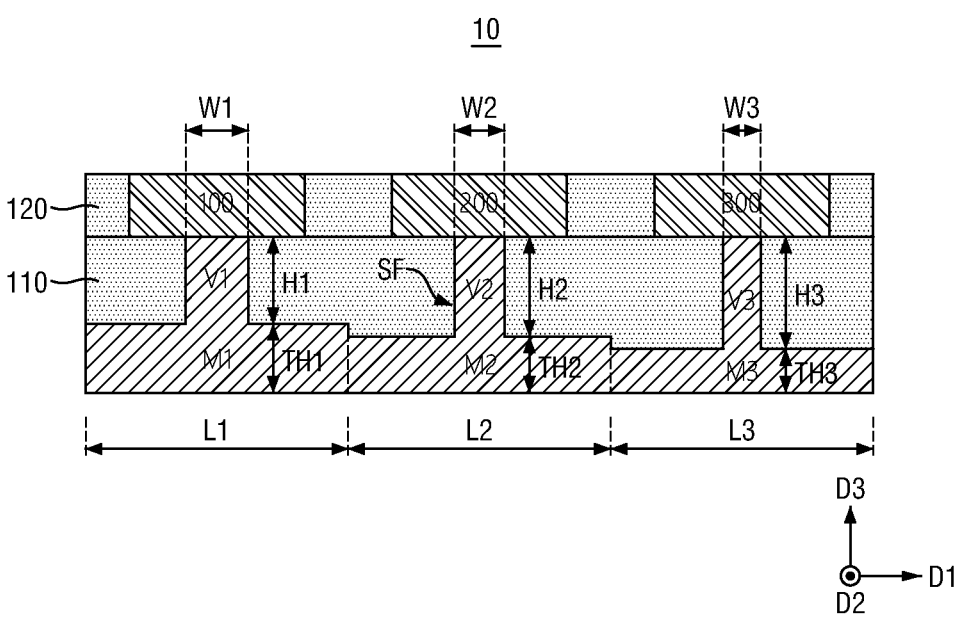
FIG. 1B illustrates a cross-section view of the integrated circuit of FIG. 1A shown in a D2 direction, according to an embodiment.

FIG. 1A illustrates a perspective view of an integrated circuit including an interconnect structure, according to an embodiment, and FIG. 1B illustrates a cross-section view of the integrated circuit of FIG. 1A shown in a D2 direction, according to an embodiment.

Referring to FIGS. 1A and 1B, an integrated circuit 10 may include a plurality of different circuit blocks. The circuit blocks may include $1^{st}$ to $3^{rd}$ circuit blocks 100, 200, and 300 that may be a high-performance circuit block, a medium-performance circuit block, and a low-performance circuit block, respectively. The $1^{st}$ to $3^{rd}$ circuit blocks 100, 200, and 300 may be connected to a metal line M through $1^{st}$ to $3^{rd}$ vias V1, V2 and V3, respectively. The integrated circuit 10 may further include an inter-metal dielectric (WED) layer 110 that isolates the $1^{st}$ to $3^{rd}$ vias V1, V2 and V3 from one another. Another IMD layer 120 may be included in the integrated circuit 10 to isolate the $1^{st}$ to $3^{rd}$ circuit blocks 100-300 from one another.

The metal line M may be extended into a D1 direction and divided into $1^{st}$ to $3^{rd}$ sections M1, M2 and M3 along the D1 direction. The $1^{st}$ to $3^{rd}$ vias V1, V2 and V3 may be formed on the $1^{st}$ to $3^{rd}$ section M1, M2 and M3, respectively. The metal line M and the $1^{st}$ to $3^{rd}$ vias V1, V2 and V3 may be formed of at least one of copper (Cu), titanium (Ti), tantalum (Ta), aluminum (Al), tungsten (W), cobalt (Co), molybdenum (Mo), ruthenium (Ru), or their combination, not being limited thereto, according to embodiments. The IMD layers 110 and 120, which may also be referred to as interlayer dielectric (ILD) structure, may be formed of $SiO_2$, $Si_3N_4$, SiOxNy, SiC, SiCO, SiCOH or SiCH compounds or their combinations, not being limited thereto.

The $1^{st}$ to $3^{rd}$ vias V1, V2 and V3 may protrude from the $1^{st}$ to $3^{rd}$ section M1, M2 and M3 of the metal line M in a D3 direction, respectively, and thus, there may not exist a connection surface between each of these vias V1, V2 and V3 and a corresponding one of the sections M1, M2 and M3, according to embodiments. For example, the $1^{st}$ via V1 and the $1^{st}$ section M1 does not have a bottom surface and a top surface, respectively, facing and connected to each other. More specifically, in some embodiments, the material comprising M1, M2 and M3 and V1, V2 and V3 may be continuous between the corresponding two portions. These protruding vias may be referred to as top vias. Although the $1^{st}$ to $3^{rd}$ vias V1, V2 and V3 each have a rectangular pillar shape in FIGS. 1A and 1B, this does not limit the shape of these vias. They may have a cylinder or tapered cylinder shape according to design and/or manufacturing methods.

Further, in the integrated circuit 10 according to the present embodiment, there may not exist a barrier metal layer formed at least between a side surface SF of each of the vias V1, V2 and V3 and the IMD structure 110. This is at least because, as describe later, the metal line M with the vias V1, V2 and V3 are formed before the IMD structure 110 is formed to isolate the vias V1, V2 and V3 from one another in the integrated circuit 10, unlike in a damascene process in which a plurality of vias are formed in a previously-provided IMD structure.

Moreover, the $1^{st}$ to $3^{rd}$ section M1, M2 and M3 may have different thicknesses in a D3 direction, according to an embodiment. For example, while the metal line M may have a thickness range of approximately 15 nm to 80 nm, the $1^{st}$ section M1 may have a thickness TH1 which is greater than a thickness TH2 of the $2^{nd}$ section M2, which is greater than a thickness TH3 of the $3^{rd}$ section M3. The $1^{st}$ to $3^{rd}$ sections M1, M2 and M3 have respective lengths L1, L2 and L3 in the D1 direction which may or may not be equal to one another. However, these example dimensions of the $1^{st}$ to $3^{rd}$ sections M1, M2 and M3 of the metal line M do not limit the disclosure thereto.

In addition, the $1^{st}$ to $3^{rd}$ vias may have different heights and widths (average diameters) according to an embodiment. For example, these vias may have a height range of approximately 20 nm to 100 nm, the $1^{st}$ via V1 may have a height H1 which is smaller than a height H2 of the $2^{nd}$ via, which is small than a height H3 of the $3^{rd}$ via V3. As another example, these vias may have a width range of 10 nm to 20 nm, the $1^{st}$ via V1 may have a width W1 which is greater than a width W2 of the $2^{nd}$ via, which is greater than a width W3 of the $3^{rd}$ via V3. Thus, the $1^{st}$ via V1 may have a smaller aspect ratio than the $2^{nd}$ via V2, which has a smaller aspect ratio than the $3^{rd}$ via. However, these example dimensions do not limit the disclosure thereto.

In the meantime, as the metal line M is extended in the D1 direction, each of the widths W1, W2 and W3 of the $1^{st}$ to $3^{rd}$ vias V1, V2 and V3 formed thereon may be smaller than the lengths L1, L2 and L3 of the $1^{st}$ to $3^{rd}$ sections M1, M2 and M3 of the metal line M, respectively, according to an embodiment.

As the $1^{st}$ to $3^{rd}$ sections M1, M2 and M3 of the metal line M have different thicknesses and/or the $1^{st}$ to $3^{rd}$ vias have different height/width combinations, their interconnect resistances may also be different from one another. For example, the thicker a metal line is, the less interconnect resistance may the metal line have, and the thicker a metal line is, the more power consumption may the metal line allow. As another example, the wider a via is, the less interconnect resistance may the via have, and the wider a via is, the more power consumption may the via allow.

Thus, the $1^{st}$ circuit block 100 may be designed to accommodate a circuit element forming a high computing performance circuit such as application processor (AP), central processing unit (CPU), graphic processing unit (GPU). In contrast, the $3^{rd}$ circuit block 300 may be designed to accommodate a circuit element forming a low power consumption circuit such as a microcontroller, a complementary-metal-oxide-semiconductor (CMOS) image sensor, etc. However, the use of each of the $1^{st}$ to $3^{rd}$ circuit blocks 100-300 connected to the different-dimension sections M1, M2 and M3 of the metal line M and vias V1, V2 and V3 as above is not limited to the above example.

According to embodiments, the interconnect structure described above may be used as a BEOL structure, an MOL structure or a combination thereof, or a BSPDN structure of the integrated circuit 10. According to embodiments, the $1^{st}$ to $3^{rd}$ vias V1, V2 and V3 may connect the $1^{st}$ to $3^{rd}$ sections of the metal line M to transistor components, such as source/drain regions or source/drain region contact plugs, of the $1^{st}$ to $3^{rd}$ circuit blocks 100, 200 and 300.

Further, although the examples provided herein illustrate three metal/via dimensional gradations (e.g., M1, M2 and M3 and respective V1, V2 and V3), the principles disclosed herein may be applied to create any number of metal/via dimensional gradations greater than three.

Herebelow, a method of manufacturing the above-described interconnect structure is described.

FIGS. 2A to 2F illustrate cross-sectional views of a method for manufacturing an interconnect structure for an integrated circuit, according to embodiments.

It is understood here that FIGS. 2A to 2F show a plurality of operations for the method for manufacturing the interconnect structure of the integrated circuit 10 shown in FIGS. 1A and 1B, and these operations may not be limited to the order presented herein.

Figure 2A:
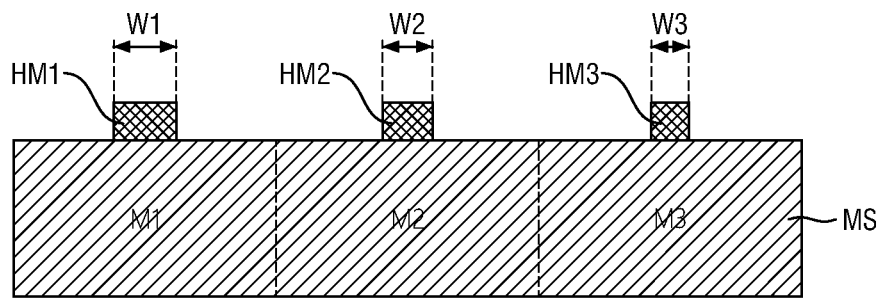

Referring to FIG. 2A, a metal structure MS divided into $1^{st}$ to $3^{rd}$ sections M1, M2 and M3 may be provided with $1^{st}$ to $3^{rd}$ hard mask patterns HM1, HM2 and HM3 respectively formed thereon, according to an embodiment.

The $1^{st}$ to $3^{rd}$ hard mask patterns HM1, HM2 and HM3 may be formed on a top surface of the metal structure MS at $1^{st}$ to $3^{rd}$ sections M1, M2 and M3 divided along the $1^{st}$ direction D1, respectively. Although FIG. 2A shows three hard mask patterns on three sections of the metal structure MS, the disclosure does not limit the number of hard mask patterns and the number of sections of the metal structure MS to three (3) as shown in FIG. 2A. The number of hard mask patterns may vary depending on the number of sections of the metal structure MS and/or the number of vias etched out from the metal structure MS in later steps as will be described below, according to embodiments.

The $1^{st}$ to $3^{rd}$ hard mask patterns HM1, HM2 and HM3 may be formed on the metal structure MS through, for example, a photolithography process and an etching process. The material(s) for these hard mask patterns may include TiN, TaN, W, $Si_3N_4$, SiC, SiO, SiON, SiCN, SiCON, other suitable materials, or a combination thereof. The composition of these hard mask patterns may be selected such that they may have etch selectivity with respect to the metal structure MS.

The $1^{st}$ to $3^{rd}$ hard mask patterns HM1, HM2 and HM3 may have different widths W1, W2 and W3 in the D1 direction (or alternatively or in combination, the D2 direction), respectively, which will define the widths of $1^{st}$ to $3^{rd}$ via structures VS1, VS2, and VS3 to be respectively formed based on these three hard mask patterns in the next operation. In the present embodiment, the width W1 of the $1^{st}$ hard mask pattern HM1 is greater than the width W2 of the $2^{nd}$ hard mask pattern HM2, which is greater than the width W3 of the $3^{rd}$ hard mask pattern HM3. However, the disclosure is not limited to this order of width.

Figure 2B:
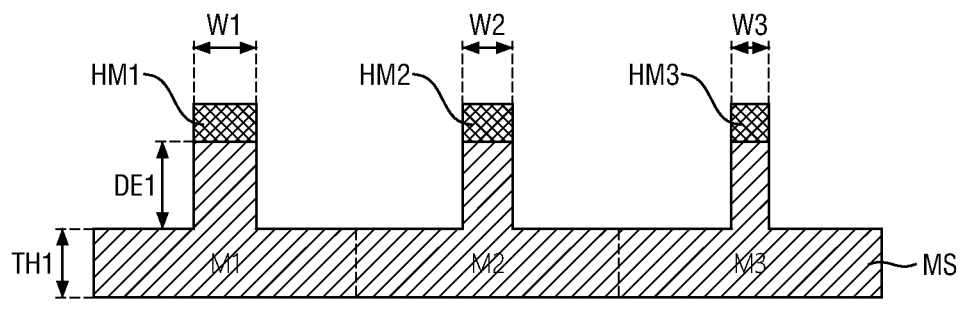

Referring to FIG. 2B, $1^{st}$ etching may be performed on the metal structure MS based on the $1^{st}$ to $3^{rd}$ hard mask patterns HM1, HM2 and HM3 to form the $1^{st}$ to $3^{rd}$ via structures VS1, VS2, and VS3 with the respective hard mask patterns HM1, HM2 and HM3 thereon, according to an embodiment.

In this operation, the $1^{st}$ etching may be performed on the metal structure MS based on the $1^{st}$ to $3^{rd}$ hard mask patterns HM1, HM2 and HM3 so that the respective widths of these hard mask patterns can be transferred down to the metal structure MS. Thus, the $1^{st}$ to $3^{rd}$ via structures formed by this $1^{st}$ etching operation may have the respective widths W1, W2 and W3 of the $1^{st}$ to $3^{rd}$ hard mask patterns HM1, HM2 and HM3.

A depth of the $1^{st}$ etching performed on the metal structure MS may be adjusted to be DE1, which is a $1^{st}$ etching depth as shown in FIG. 2B, according to an embodiment. Thus, the $1^{st}$ to $3^{rd}$ via structures VS1, VS2, and VS3 may have the same protrusion heights (lengths) which are equal to the $1^{st}$ etching depth DE1, and further, the $1^{st}$ to $3^{rd}$ sections M1, M2 and M3 of the metal structure MS (except at portions where the $1^{st}$ to $3^{rd}$ via structures VS1, VS2, and VS3 protrude) may have a same thickness TH1, according to an embodiment.

The $1^{st}$ etching on the metal structure MS may be performed through, for example, anisotropic dry etching such as reactive ion etching (RIE), not being limited thereto.

Each of the $1^{st}$ to $3^{rd}$ via structures VS1, VS2, and VS3 formed in this operation may be referred to as a top via structure which does not have a connection surface with the metal structure MS because they are simply etched out from the metal structure MS as described above without using a damascene process.

Figure 2C:
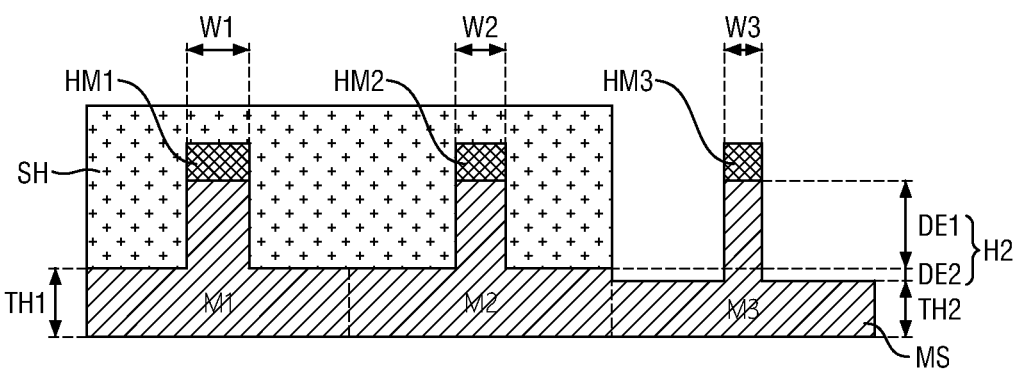

Referring to FIG. 2C, the $1^{st}$ and $2^{nd}$ sections M1 and M2 of the metal structure MS with the protruding via structures VS1 and VS2 may be masked by a selective hard mask structure SH, and $2^{nd}$ etching may be performed on the metal structure MS, according to an embodiment.

For this operation, the selective hard mask structure SH may be deposited on the $1^{st}$ and $2^{nd}$ sections M1 and M2 of the metal structure MS to cover the $1^{st}$ and $2^{nd}$ via structures VS1 and VS2 with the $1^{st}$ and $2^{nd}$ hard mask patterns HM1 and HM2 thereon, according to an embodiment. Due to this selective deposition, the $3^{rd}$ section M3 of the metal structure MS in which the $3^{rd}$ via structure VS3 with the $3^{rd}$ hard mask pattern HM3 thereon may be exposed.

The selective hard mask structure SH may be formed of one or more materials selected from TiN, TaN, W, $Si_3N_4$, SiC, SiO, SiON, SiCN, SiCON, other suitable materials, and a combination thereof, not being limited thereto, similar to the material(s) forming the $1^{st}$ to $3^{rd}$ hard mask patterns HM1 to HM3. However, the material(s) forming the selective hard mask structure SH may be selected to have etch selectively with respect to the material(s) forming the $1^{st}$ to $3^{rd}$ hard mask patterns HM1, HM2 and HM3. The selective deposition in this operation may be performed by, for example, chemical vapor deposition (CVD), physical vapor deposition (PVD), plasma-enhanced chemical vapor deposition (PECVD), atomic layer deposition (ALD), not being limited thereto.

Subsequently, the $2^{nd}$ etching may be performed on the $3^{rd}$ section M3 of the metal structure MS based on the selective hard mask structure SH and the $3^{rd}$ hard mask pattern HM3 on the $3^{rd}$ via structure VS3. The $2^{nd}$ etching may be performed by, for example, anisotropic dry etching such as reactive ion etching (RIE), not being limited thereto.

A depth of the $2^{nd}$ etching performed on the $3^{rd}$ section M3 of the metal structure MS may be adjusted to be DE2, which is a $2^{nd}$ etching depth as shown in FIG. 2C, according to an embodiment. Thus, the $3^{rd}$ section M3 of the metal structure MS except at a portion where the $3^{rd}$ via structure VS3 protrudes may have a thickness TH2 which is smaller than the thickness TH1 of the $1^{st}$ and $2^{nd}$ sections M1 and M2 by the $2^{nd}$ etching depth DE2. In contrast, the $3^{rd}$ via structure VS3 protruding from the $3^{rd}$ section M3 may have a height H2 which is greater than the height ($1^{st}$ etching depth DE1) of the $1^{st}$ and $2^{nd}$ via structures VS1 and VS2 by the $2^{nd}$ etching depth DE2, while the $3^{rd}$ via structures VS3 has the smaller width W3 than the $1^{st}$ and $2^{nd}$ via structures VS1 and VS2.

Here, the $2^{nd}$ etching depth DE2 may be equal to the etching depth DE1, according to an embodiment. However, these two etching depths may not necessarily be equal to each other, according to embodiments.

Unlike the selective deposition and etching operations described above, the $3^{rd}$ section M3 of the metal structure MS with the $3^{rd}$ via structure VS3 and the $3^{rd}$ hard mask pattern HM3 thereon as shown in FIG. 2C may be obtained by depositing a hard mask material(s) on the structure obtained from the previous operation shown in FIG. 2B and selectively etching this hard mask material(s) at a portion above the $3^{rd}$ section M3, according to an embodiment.

Figures 2D, 2E, 2F:
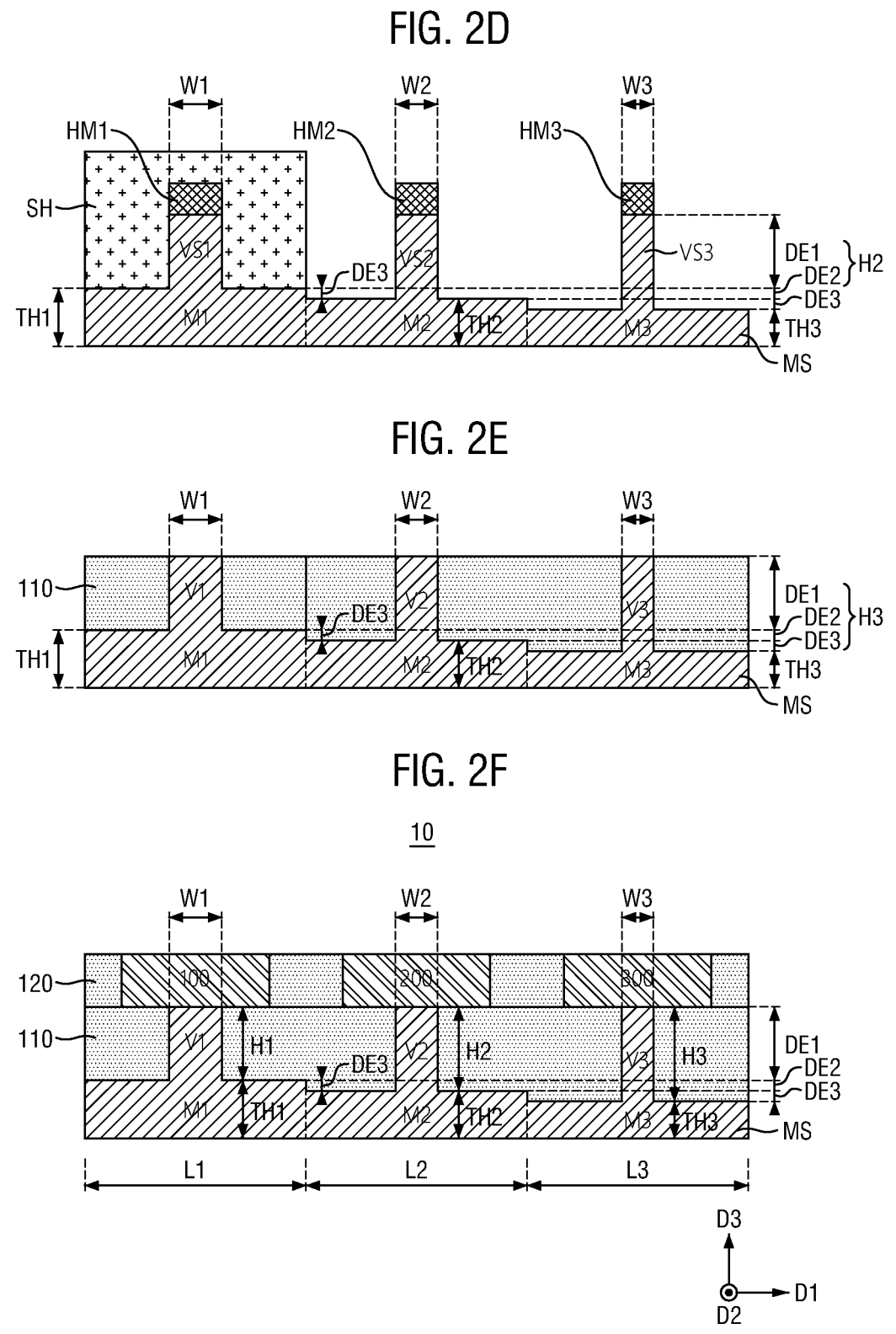

Referring to FIG. 2D, the selective hard mask structure SH may be removed from above the $2^{nd}$ section M2 of the metal structure MS to expose the $2^{nd}$ section M2 of the metal structure MS and the $2^{nd}$ via structure VS2 with the $2^{nd}$ hard mask pattern HM2 thereon, and $3^{rd}$ etching may be performed on the metal structure MS, according to an embodiment.

For example, an ashing operation such as plasma ashing or plasma etching, not being limited thereto, may be performed to remove the selective hard mask structure SH from above the $2^{nd}$ section M2 of the metal structure MS. Although not shown, an additional masking on the $1^{st}$ and $3^{rd}$ sections M1 and M3 may be required for this selective ashing or etching operation.

Subsequently, the $3^{rd}$ etching may be performed on the $2^{nd}$ and $3^{rd}$ sections M2 and M3 of the metal structure MS based on the selective hard mask structure SH and the $2^{nd}$ and $3^{rd}$ hard mask patterns HM2 and HM3 remaining on the $2^{nd}$ and $3^{rd}$ via structure VS2 and VS3. The $3^{rd}$ etching may also be performed by, for example, anisotropic dry etching such as reactive ion etching (RIE), not being limited thereto.

A depth of the $3^{rd}$ etching performed on the $2^{nd}$ and $3^{rd}$ sections M2 and M3 of the metal structure MS may be adjusted to be DE3, which is a $3^{rd}$ etching depth as shown in FIG. 2D, according to an embodiment. Thus, the $2^{nd}$ section M2 of the metal structure MS (except at a portion where the $2^{nd}$ via structure VS2 protrudes) may have a thickness TH2 which is smaller than the thickness TH1 of the $1^{st}$ section M1 by the $3^{rd}$ etching depth DE3. Instead, the $2^{nd}$ via structure VS2 on the $2^{nd}$ section M2 may have the height H2 which is greater than the height ($1^{st}$ etching depth DE1) of the $1^{st}$ via structure VS1 by the $3^{rd}$ etching depth DE3, while the $2^{nd}$ via structure VS2 has the smaller width W2 than the $1^{st}$ via structures VS1.

Further, the $3^{rd}$ section M3 of the metal structure MS (except at the portion where the $3^{rd}$ via structure VS3 protrudes) may have a thickness TH3 which is smaller than the thickness TH2 of the $2^{nd}$ section M2 by the $3^{rd}$ etching depth DE3. Instead, the $3^{rd}$ via structure VS3 on the $3^{rd}$ section M3 may have a height H3 which is greater than the height H2 of the $2^{nd}$ via structure VS2 by the $3^{rd}$ etching depth DE3, while the $3^{rd}$ via structures VS3 still has the smaller width W3 than the $1^{st}$ and $2^{nd}$ via structures VS1 and VS2.

The $3^{rd}$ etching depth DE3 may be equal to the $2^{nd}$ etching depth DE2, and the $3^{rd}$ etching depth DE3 may even be equal to the $1^{st}$ etching depth DE1, according to an embodiment. However, these three etching depths may not necessarily be equal to one another, according to embodiments.

Referring to FIG. 2E, the selective hard mask structure SH remaining above the $1^{st}$ section M1 of the metal structure MS and the $1^{st}$ to $3^{rd}$ hard mask patterns HM1, HM2 and HM3 may be removed to obtain an interconnect structure including a metal line M divided into the $1^{st}$ to $3^{rd}$ sections M1, M2 and M3 from which $1^{st}$ to $3^{rd}$ vias V1, V2 and V3 protrude, according to an embodiment.

In this operation, the remaining selective hard mask structure SH and the $1^{st}$ to $3^{rd}$ hard mask patterns HM1, HM2 and HM3 may be removed by, for example, a repeated ashing operation such as plasma ashing or plasma etching, not being limited thereto. Although not shown, an additional masking on the $2^{nd}$ and $3^{rd}$ sections M2 and M3 of the metal structure MS may be applied for this ashing or etching operation.

After the ashing or etching operation, the metal structure MS divided into the $1^{st}$ to $3^{rd}$ sections M1, M2 and M3 having respectively different thicknesses TH1-TH3 may become the metal line M as shown in FIGS. 1A and 1B. In addition, the $1^{st}$ to $3^{rd}$ via structures VS1, VS2, and VS3 respectively protruding from the $1^{st}$ to $3^{rd}$ sections M1, M2 and M3 of the metal structure MS may become the $1^{st}$ to $3^{rd}$ vias V1, V2 and V3, which are all top vias, having respectively different height/width combinations H1/W1, H2/W2 and H3/W3 as shown in FIGS. 1A and 1B.

Further, the EMI) structure 110 may be formed on the metal line M to isolate the $1^{st}$ to $3^{rd}$ vias V1, V2 and V3 from one another. Here, a barrier metal layer that is layered on an inner surface of a via hole where a via structure is filled in a damascene process may not be required in the interconnect structure manufactured in the above method. Thus, RC characteristics of an integrated circuit including the interconnect structure obtained in the above method may be improved.

Referring to FIG. 2F, the interconnect structure obtained in the previous operation as shown in FIG. 2E may be connected to $1^{st}$ to $3^{rd}$ circuit blocks 100, 200, and 300 through the $1^{st}$ to $3^{rd}$ vias V1, V2 and V3, according to an embodiment.

For example, the $1^{st}$ to $3^{rd}$ sections M1, M2 and M3 of the metal line M may be connected to $1^{st}$ to $3^{rd}$ circuit blocks 100, 200, and 300 which are respectively a high-performance circuit block, a medium-performance circuit block, and a low-performance circuit block through the $1^{st}$ to $3^{rd}$ vias V1, V2 and V3, respectively.

In the above-described method, the interconnect structure is manufactured to have three different metal line thicknesses TH1, TH2 and TH3 in this order for the $1^{st}$ to $3^{rd}$ sections M1, M2 and M3 of the metal line M, respectively, and three different via widths W1, W2 and W3 in this order and three different via heights H3, H2 and H1 in this order for the $1^{st}$ to $3^{rd}$ vias V1, V2 and V3, respectively. However, the disclosure is not limited to these dimension orders. Subject to the use of a plurality of circuit blocks in an integrated circuit in terms of performance characteristics or power consumption, different dimensions or dimension orders may apply to the $1^{st}$ to $3^{rd}$ metal line sections M1, M2 and M3 and the $1^{st}$ to $3^{rd}$ vias V1, V2 and V3 of the above interconnect structure. In addition, the number of metal line sections or the number of protruding vias may not be limited to three.

In the meantime, in the above embodiments, the $1^{st}$ to $3^{rd}$ circuit blocks 100, 200, and 300 are connected to a common metal line M at the $1^{st}$ to $3^{rd}$ sections M1, M2 and M3 through the $1^{st}$ to $3^{rd}$ vias V1, V2 and V3. However, the $1^{st}$ to $3^{rd}$ section of the metal line M may be separated by another isolation structure in another operation (not shown), according to a different embodiment.

FIG. 3 illustrates a flowchart of the method described in reference to FIGS. 2A to 2F, according to embodiments.

In operation S10, a metal structure divided into $1^{st}$ to $3^{rd}$ sections may be provided with $1^{st}$ to $3^{rd}$ hard mask patterns, having different widths, respectively formed thereon.

In operation S20, $1^{st}$ etching may be performed on the metal structure based on the $1^{st}$ to $3^{rd}$ hard mask patterns to form the $1^{st}$ to $3^{rd}$ via structures, having the same heights and different widths, respectively protruding from the respective $1^{st}$ to $3^{rd}$ sections.

In operation S30, the $1^{st}$ and $2^{nd}$ sections in which the $1^{st}$ and $2^{nd}$ via structures protrude may be masked by a selective hard mask structure, and $2^{nd}$ etching may be performed on the exposed $3^{rd}$ section with the $3^{rd}$ via structure, thereby forming the $3^{rd}$ section having a smaller thickness than the $1^{st}$ and $2^{nd}$ sections, and the $3^{rd}$ via structure having a greater height and a smaller width than the $1^{st}$ and $2^{nd}$ via structures.

In operation S40, the selective hard mask structure may be partially removed to expose the $2^{nd}$ section of the metal structure and the $2^{nd}$ via structure, and $3^{rd}$ etching may be performed on the exposed $2^{nd}$ and $3^{rd}$ sections with the $2^{nd}$ and $3^{rd}$ via structures, thereby forming the $2^{nd}$ section having a smaller thickness than the $1^{st}$ section, the $2^{nd}$ via structure having a greater height and a smaller width than the $1^{st}$ via structure, the $3^{rd}$ section having a smaller thickness than the $2^{nd}$ section, and the $3^{rd}$ via structure having a greater height and a smaller width than the $2^{nd}$ via structure.

In operation S50, the selective hard mask structure and the $1^{st}$ to $3^{rd}$ hard mask patterns are entirely removed from the metal structure and the $1^{st}$ to $3^{rd}$ via structures to obtain an interconnect structure including a metal line having the $1^{st}$ to $3^{rd}$ sections having different thicknesses and the $1^{st}$ to $3^{rd}$ vias having different width/height combinations, and an IMD structure may be formed on the metal line to isolate the $1^{st}$ to $3^{rd}$ vias from one another.

In operation S60, the interconnect structure obtained in operation S50 may be connected to a plurality of circuit blocks such that the $1^{st}$ to $3^{rd}$ sections of the metal line are connected to a high-performance circuit block, a medium-performance circuit block, and a low-performance circuit block through the $1^{st}$ to $3^{rd}$ vias, respectively.

According to the above embodiments of the disclosure, it may be possible to achieve formation of a plurality of circuit blocks having different performance characteristics in a single integrated circuit chip (or SOC). Since these different circuit blocks may be connected to the above-described interconnect structure including a plurality of metal line sections and vias having different dimensions, power consumption of the entire integrated circuit may be reduced or controlled. Further, the vias included in the interconnect structure of the above embodiments are top vias formed from the metal line sections, RC characteristics of the integrated circuit may also be improved. In addition, the top vis formation may enable the manufacturing process of the interconnect structure to be more simplified than the damascene process.

Figure 4:
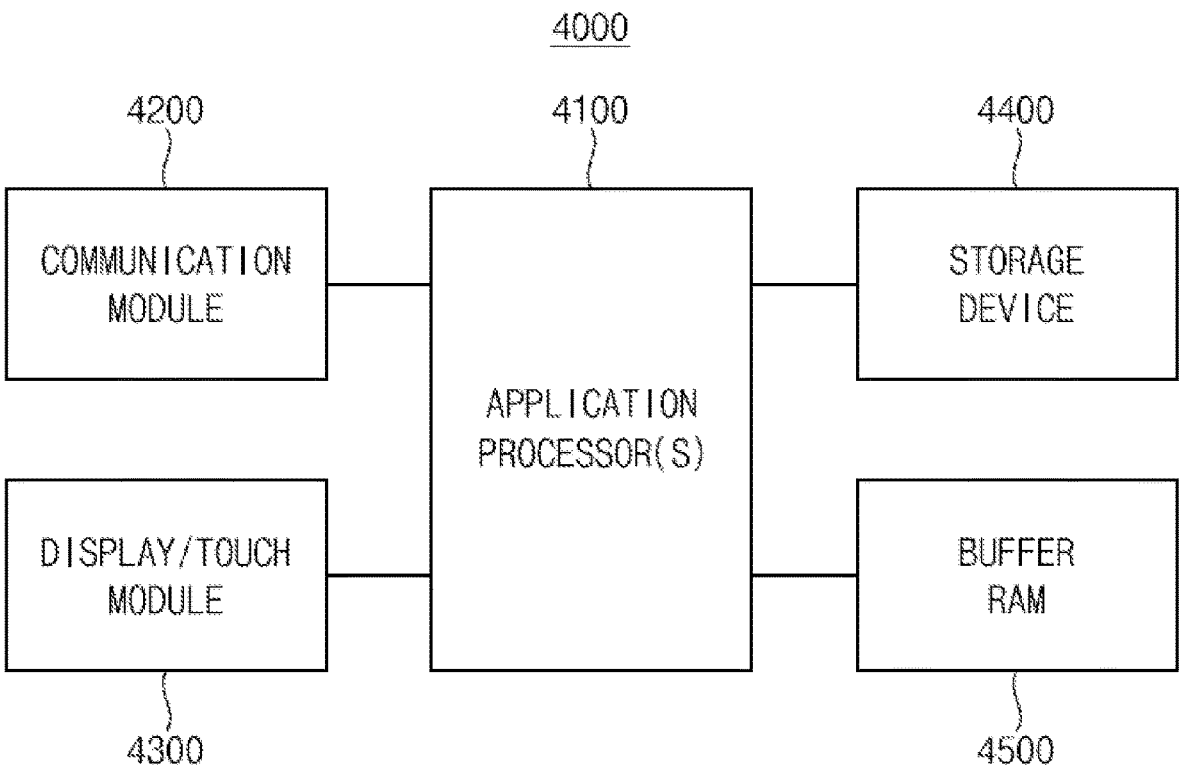
FIG. 4 is a schematic block diagram illustrating an electronic device including an integrated circuit 10 shown in FIGS. 1A and 1B, according to an example embodiment.

FIG. 4 is a schematic block diagram illustrating an electronic device including an integrated circuit 10 shown in FIGS. 1A and 1B, according to an example embodiment.

Referring to FIG. 9, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 may be implemented to perform wireless or wire communications with an external device. The display/touch module 4300 may be implemented to display data processed by the application processor 4100 and/or to receive data through a touch panel. The storage device 4400 may be implemented to store user data. The storage device 4400 may be an embedded multimedia card (eMMC), a solid state drive (SSD), a universal flash storage (UFS) device, etc., not being limited thereto. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one of the components described above in the electronic device 4000 may include the integrated circuit 10 shown in FIGS. 1A and 1B, according to embodiments.

The foregoing is illustrative of exemplary embodiments and is not to be construed as limiting the inventive concept. Although a few exemplary embodiments have been described, those skilled in the art will readily appreciate that many modifications are possible in the above embodiments without materially departing from the inventive concept.

What is claimed is:

1. An interconnect structure for an integrated circuit, the interconnect structure comprising:
   a metal line extending in a $1^{st}$ direction perpendicular to a $2^{nd}$ direction, the metal line comprising a plurality of sections having different thicknesses in a $3^{rd}$ direction perpendicular to the $1^{st}$ direction and the $2^{nd}$ direction; and
   a plurality of vias respectively protruding from the sections of the metal line in the $3^{rd}$ direction,
   wherein the metal line extends in the $1^{st}$ direction such that a length of the metal line in the $1^{st}$ direction is greater than a length in the $2^{nd}$ direction.

2. The interconnect structure of claim 1, wherein the sections of the metal line comprise $1^{st}$, $2^{nd}$ and $3^{rd}$ sections along the $1^{st}$ direction, the $2^{nd}$ section being between the $1^{st}$ and $3^{rd}$ sections, and
   wherein the $1^{st}$ section has a greater thickness than the $2^{nd}$ section, which has a greater thickness than the $3^{rd}$ section, in the $3^{rd}$ direction.

3. The interconnect structure of claim 1, wherein the vias have different protrusion heights in the $3^{rd}$ direction, and have different widths in the $1^{st}$ direction, and
   wherein the protrusion heights of the vias are respectively measured from lowermost portions of the vias to uppermost portions of the vias.

4. The interconnect structure of claim 3, wherein the sections comprise $1^{st}$ and $2^{nd}$ sections, and the vias comprise $1^{st}$ and $2^{nd}$ vias protruded from the $1^{st}$ and $2^{nd}$ sections, respectively, and
   wherein widths of the $1^{st}$ and $2^{nd}$ vias are smaller than lengths of the $1^{st}$ and $2^{nd}$ sections, respectively, in the $1^{st}$ direction.

5. The interconnect structure of claim 4, wherein each of the $1^{st}$ and $2^{nd}$ sections and each of the $1^{st}$ and $2^{nd}$ vias protruding therefrom is a single continuous structure without a connection surface therebetween.

6. The interconnect structure of claim 5, further comprising a dielectric structure isolating the $1^{st}$ and $2^{nd}$ vias from each other, wherein each of the $1^{st}$ and $2^{nd}$ vias and the dielectric structure does not have a barrier metal layer therebetween.

7. The interconnect structure of claim 1, wherein each of the sections and each of the vias protruding therefrom is a single continuous structure without a connection surface therebetween.

8. The interconnect structure of claim 7, further comprising a dielectric structure isolating the vias from each other,
   wherein each of the vias and the dielectric structure do not have a barrier metal layer therebetween.

9. An integrated circuit comprising:
   a plurality of circuit blocks comprising a plurality of semiconductor devices, respectively,
   wherein the sections of the metal line of claim 1 are connected to the circuit blocks through the vias, respectively.

10. An interconnect structure for an integrated circuit, the interconnect structure comprising:
   a metal line comprising a plurality of sections extending in a $1^{st}$ direction perpendicular to a $2^{nd}$ direction; and
   a plurality of vias respectively protruding from the plurality of sections, the vias having different protrusion heights in a $3^{rd}$ direction perpendicular to the $1^{st}$ direction and the $2^{nd}$ direction, and different widths in at least one of the $1^{st}$ direction and the $2^{nd}$ direction,
   wherein the protrusion heights of the vias are respectively measured from lowermost portions of the vias to uppermost portions of the vias,
   wherein the metal line extends in the $1^{st}$ direction such that a length of the metal line in the $1^{st}$ direction is greater than a length in the $2^{nd}$ direction,
   wherein the vias comprise $1^{st}$ and $2^{nd}$ vias respectively protruding from $1^{st}$ and $2^{nd}$ sections among the plurality of sections of the metal line, and
   wherein a lowermost portion of the $1^{st}$ via is non-coplanar with a lowermost portion of the $2^{nd}$ via, and an uppermost portion of the $1^{st}$ via is coplanar with an uppermost portion of the $2^{nd}$ via.

11. The interconnect structure of claim 10,
   wherein the $1^{st}$ via has a smaller protrusion height than the $2^{nd}$ via, and
   wherein the $1^{st}$ via has a greater width than the $2^{nd}$ via in the $1^{st}$ direction.

12. The interconnect structure of claim 10, wherein the sections of the metal line have different thicknesses in the $3^{rd}$ direction.

13. The interconnect structure of claim 12,
   wherein widths of the $1^{st}$ and $2^{nd}$ vias are smaller than lengths of the $1^{st}$ and $2^{nd}$ sections, respectively, in at least one of the $1^{st}$ and $2^{nd}$ directions.

14. The interconnect structure of claim 13, wherein each of the $1^{st}$ and $2^{nd}$ sections and each of the $1^{st}$ and $2^{nd}$ vias protruding therefrom is a single continuous structure without a connection surface therebetween.

15. The interconnect structure of claim 14, further comprising a dielectric structure isolating the vias from each other,
   wherein each of the $1^{st}$ and $2^{nd}$ vias and the dielectric structure do not have a barrier metal layer therebetween.

16. The interconnect structure of claim 10, wherein each of the sections and each of the vias protruding therefrom is a single continuous structure without a connection surface therebetween.

17. The interconnect structure of claim 16, further comprising a dielectric structure isolating the vias from each other, wherein each of the vias and the dielectric structure do not have a barrier metal layer therebetween.

18. An integrated circuit comprising:

a plurality of circuit blocks comprising a plurality of semiconductor devices, respectively, wherein the sections of the metal line of claim 10 are connected to the circuit blocks through the vias, respectively.

19. The integrated circuit of claim 9, wherein the semiconductor devices have respectively different performance characteristics comprising power consumption.

20. The integrated circuit of claim 18, wherein the semiconductor devices have respectively different performance characteristics comprising power consumption.

\* \* \* \* \*